(12) United States Patent
Cheng et al.

(10) Patent No.: US 9,604,840 B1
(45) Date of Patent: Mar. 28, 2017

(54) MEMS DEVICE

(71) Applicant: TAIWAN SEMICONDUCTOR MANUFACTURING COMPANY LTD., Hsinchu (TW)

(72) Inventors: Chun-Wen Cheng, Hsinchu County (TW); Jiou-Kang Lee, Hsinchu (TW)

(73) Assignee: TAIWAN SEMICONDUCTOR MANUFACTURING COMAPNY LTD., Hsinchu (TW)

( * ) Notice: Subject to any disclaimer, the term of this patent is extended or adjusted under 35 U.S.C. 154(b) by 0 days.

(21) Appl. No.: 15/007,744

(22) Filed: Jan. 27, 2016

(51) Int. Cl.
*H01L 27/14* (2006.01)
*H01L 29/82* (2006.01)
*H01L 29/84* (2006.01)
*B81B 3/00* (2006.01)

(52) U.S. Cl.
CPC .... *B81B 3/0072* (2013.01); *B81B 2203/0163* (2013.01)

(58) Field of Classification Search
CPC ........... H01L 2924/1461; B81B 3/0072; B81B 2203/0163

USPC ................................................. 257/414, 415
See application file for complete search history.

(56) References Cited

U.S. PATENT DOCUMENTS

2016/0060098 A1\* 3/2016 Ikehashi ............... B81B 3/0021
257/415
2016/0083248 A1\* 3/2016 Xu .................. H01L 21/823437
257/415

\* cited by examiner

*Primary Examiner* — Thien F Tran
(74) *Attorney, Agent, or Firm* — WPAT, P.C., Intellectual Property Attorneys; Anthony King

(57) ABSTRACT

A device includes a stationary structure, a spring and a proof mass. The stationary structure has a first portion and a second portion. The spring is over a substrate. The spring has a first protrusion protruded from an edge and extended toward the first portion of the stationary structure. The proof mass is over the substrate and supported by the sparing. The proof mass has a second protrusion protruded from an edge and extended toward the second portion of the stationary structure. A first gap between the first protrusion and the first portion is less than a second gap between the second protrusion and the second portion.

20 Claims, 9 Drawing Sheets

MEMS DEVICE

BACKGROUND

Microelectromechanical Systems (MEMS) device is a micro-sized device, normally in a range from less than 1 micron to several millimeters in size. The MEMS device includes mechanical elements (stationary element and/or movable element) to sense a physical condition such as force, acceleration, pressure, temperature or vibration, and electronic elements to process electrical signals. The MEMs devices are widely used in applications such as automotive system, inertial guidance systems, household appliances, protection systems for a variety of devices, and many other industrial, scientific, and engineering systems. Moreover, MEMS applications are extended to optical applications, such as movable mirrors, and radio frequency (RF) applications, such as RF switches.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
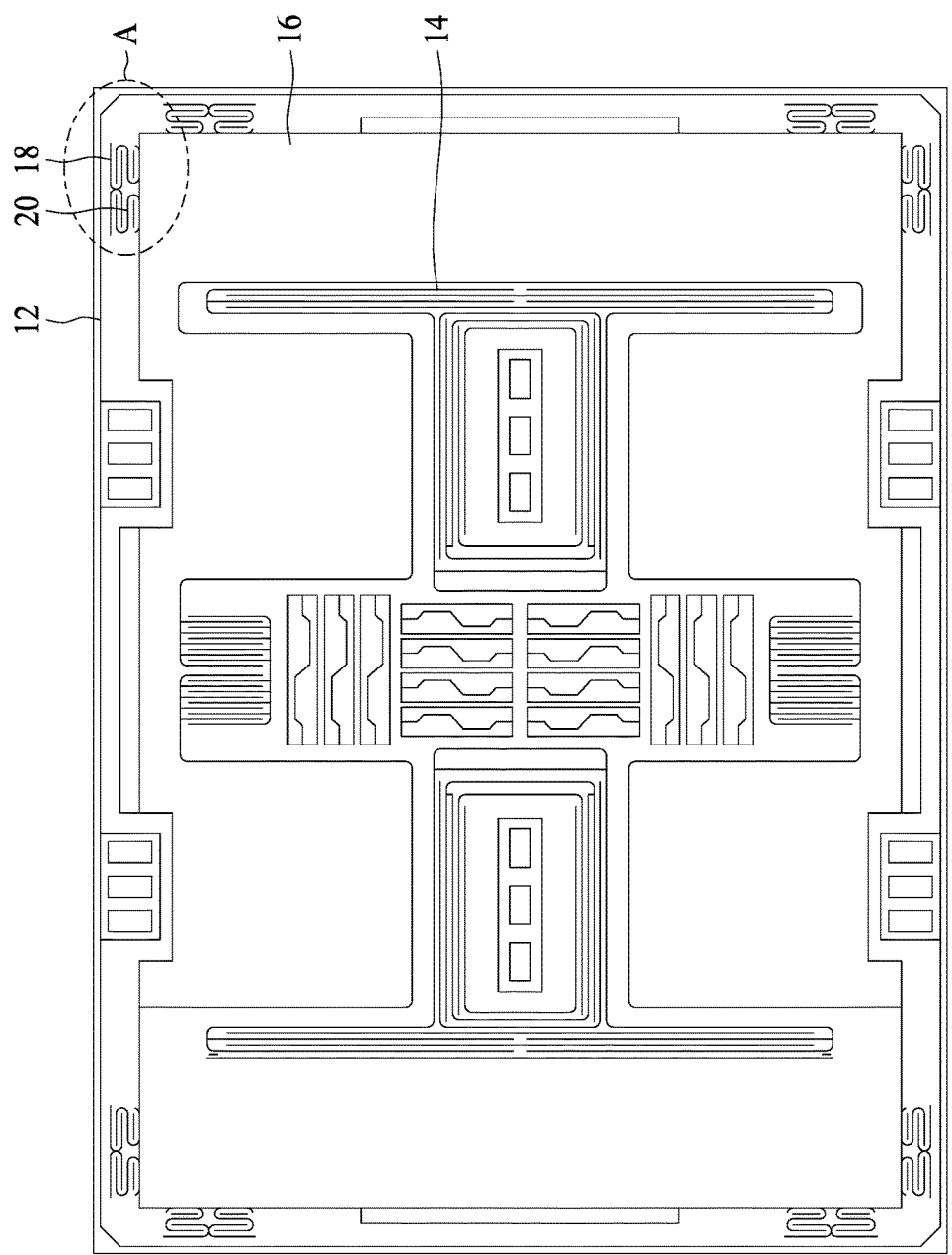
FIG. 1 is a schematic top view of some embodiments of a device.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, a device including a suspended movable structure and a resilient structure is provided. The movable structure is suspended from e.g., a substrate with a space such as an air space. The resilient structure is a flexible/elastic structure, which allows extending, compressing, deforming or swinging to a certain degree. One of the ends of the resilient structure is fixed to an object e.g., a substrate, while another one of the ends is structurally connected to the suspended movable structure in such a manner that the suspended movable structure is able to move, swing or rotate when the device experiences a force, an acceleration, a deceleration, a vibration, an impact or the like.

In the present disclosure, the device includes, but is not limited to, a Microelectromechanical Systems (MEMS) device, such as a motion sensor device, an accelerometer device, or a gyroscope device. The suspended movable structure may include a proof mass, a diaphragm, or any other movable structures. The resilient structure may include a spring, or any other resilient structures with resilience.

As used herein, a "substrate" refers to a base material on which various layers and structures are formed. In some embodiments, the substrate includes a semiconductor substrate, such as a bulk semiconductor substrate. By way of example, the bulk semiconductor substrate includes an elementary semiconductor, such as silicon or germanium; a compound semiconductor, such as silicon germanium, silicon carbide, gallium arsenic, gallium phosphide, indium phosphide, or indium arsenide; or combinations thereof. In some embodiments, the substrate includes a multilayered substrate, such as a silicon-on-insulator (SOI) substrate, which includes a bottom semiconductor layer, a buried oxide layer (BOX) and a top semiconductor layer. In still some embodiments, the substrate includes an insulative substrate, such as a glass substrate, a conductive substrate, or any other suitable substrate. In some embodiments, the substrate is a doped semiconductor substrate.

As used herein, "suspended" refers to a structure disposed above and spaced away from another structure, thereby allowing the structure is able to move in at least one direction with respective to another structure.

As used herein, a "movable structure" refers to a structure that is formed over the substrate or part of the substrate, where some part of the movable structure is directly or indirectly coupled to the a resilient structure, and some part of the movable structure is suspended over the substrate or some part of the substrate with a space therebetween. Accordingly, the movable structure is able to move or swing when experiencing a force, an acceleration, a deceleration, a vibration, an impact or the like. In some embodiments, the movable structure is conductive. In some embodiments, the movable structure is covered with a conductive layer. In some embodiments, the movable structure is not conductive.

As used herein, a "resilient structure" refers to a structure that is formed over the substrate part of the substrate, where some part of the resilient structure is fixed on the substrate or other fixed structure, and some part of the resilient structure is directly or indirectly coupled to the movable structure. The resilient structure is a flexible/elastic structure, which allows extending, compressing, or deforming to a certain degree. In some embodiments, the resilient structure has a winding pattern that allows the resilient structure to extend or compress. In some embodiments, the movable structure has a mass greater than that of the resilient structure, and thus the movable structure is able to move or swing due to inertial effect when experiencing a force, an acceleration, a deceleration, a vibration, an impact or the like. In some embodiments, the resilient structure is conductive. In some embodiments, the resilient structure is covered with a conductive layer. In some embodiments, the resilient structure is not conductive.

As used herein, a "stationary structure" or a "fixed structure" refers to a structure that is immobile with respect to the movable structure and the resilient structure when experiencing a force, an acceleration, a deceleration, a vibration, an impact or the like. The stationary structure or the fixed structure may be formed directly or indirectly on the substrate, or is a part of the substrate. In some embodiments, the stationary structure is conductive. In some embodiments, the stationary structure is covered with a conductive layer. In some embodiments, the stationary structure is not conductive.

As used herein, "monolithically formed" refers to two or more structures are formed of the same material(s) and simultaneously. By way of example, two or more structures are formed by the same lithography.

As used herein, a "protrusion" is a structure protruded from a perimeter or an edge of another structure. The protrusion can be either formed of the same material(s) as or different materials from the structure from where the protrusion is protruded.

As used herein, a "bumper" is a structure configured as a buffer to reduce damage in a collision and to avoid undesired adhesion.

Figure 1A:
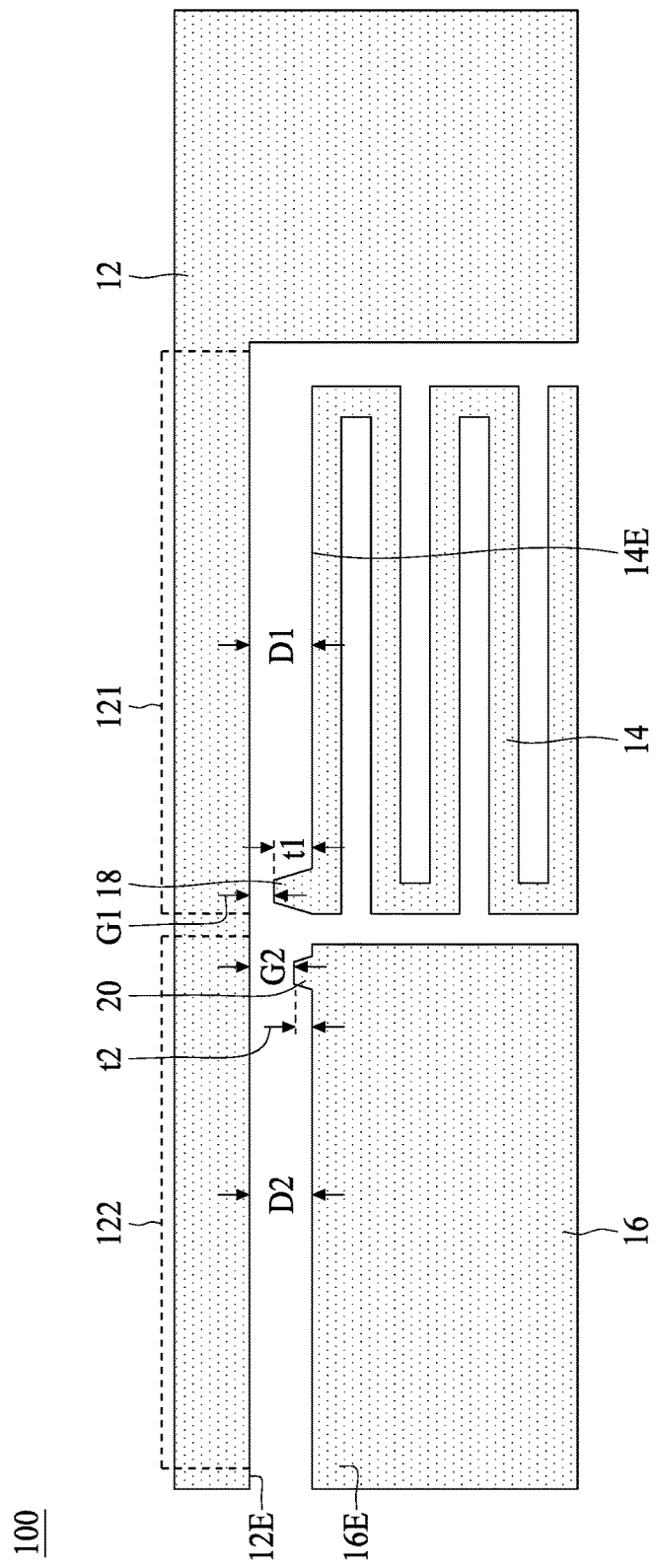
FIG. 1A is an enlarged schematic top view of some embodiments of a region A in FIG. 1.
Figure 1B:
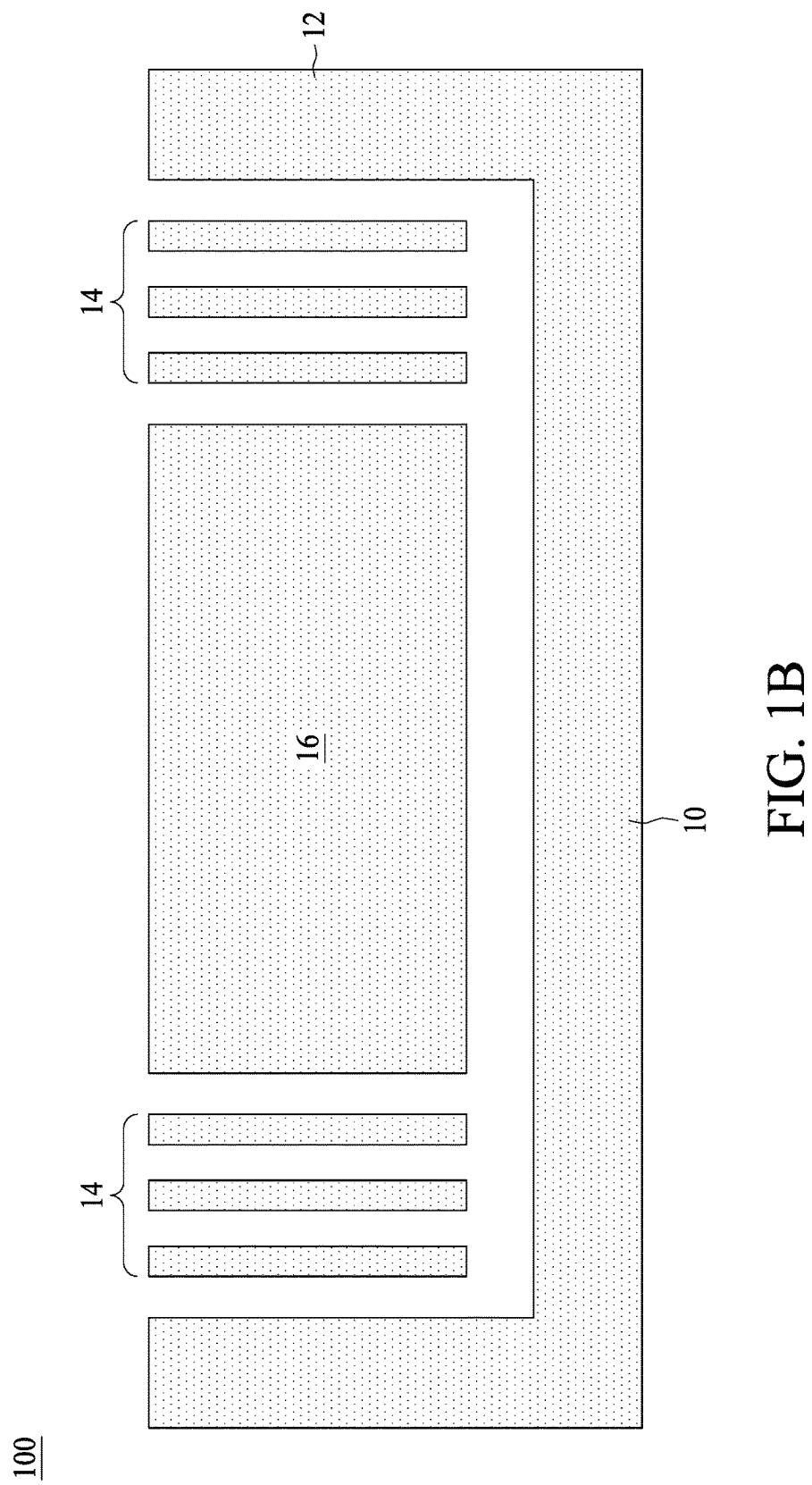
FIG. 1B is a schematic cross-sectional view of some embodiments of a device corresponding to FIG. 1A.

FIG. 1 is a schematic top view of some embodiments of a device. FIG. 1A is an enlarged schematic top view of some embodiments of a region A in FIG. 1. FIG. 1B is a schematic cross-sectional view of some embodiments of a device corresponding to FIG. 1A. In some embodiments, the device 100 is a MEMS device. By way of example, the MEMS device includes a motion sensor device able to sense motion, an accelerometer device able to sense acceleration or deceleration, a gyroscope device able to sense angular velocity, or any other devices with movable structure. In some embodiments, the device is a single-axis MEMS device able to sense motion, acceleration or angular velocity in one single direction (e.g., Y direction) in a plane. In some other embodiments, the device is a double-axis MEMS device able to sense motion, acceleration or angular velocity in two directions (e.g., X, Y directions) in a plane. In still other embodiments, the device is a triple-axis MEMS device able to sense motion, acceleration or angular velocity in three directions (e.g., X, Y, Z directions).

The device 100 includes a substrate 10, a first structure 12, a second structure 14, a third structure 16, a first protrusion 18 and a second protrusion 20. The first structure 12 is disposed over the substrate 10. In some embodiments, the first structure 12 is a stationary structure fixed on the substrate 10. For example, the first structure 12 may be a fixed frame of the device 100. In some embodiments, the first structure 12 is a part of the substrate 10, i.e. the substrate 10 and the first substrate 12 may be formed of the same material and monolithically formed. In some alternative embodiments, the first structure 12 is mounted on the substrate 10 with another intermediate structure(s), such as an insulative layer or an adhesive layer. The first structure 12 has a first edge 12E facing the second structure 14 and the third structure 16. The first structure 12 includes a first portion 121 and a second portion 122. In some embodiments, the first portion 121 and the second portion 122 are connected to each other. In some alternative embodiments, the first portion 121 and the second portion 122 are disconnected from each other.

The second structure 14 is disposed over the substrate 10. In some embodiments, the second structure 14 is a resilient structure. The resilient structure is a flexible structure or an elastic structure, which allows extending, compressing or deforming to a certain degree. By way of example, the second structure 14 is a spring. The second structure 14 has a fixed end which is directly or indirectly coupled to a fixed structure such as a portion of the substrate 10 or a portion of the first structure 12. The second structure 14 has a movable end coupled to the third structure 16. In some embodiments, the second structure 14 is a part of the substrate 10, i.e. the substrate 10 and the second structure 14 may be formed of the same material and monolithically formed. The second structure 14 has a second edge 14E facing and spaced away from the first edge 12E of the first structure 12. Specifically, the second edge 14E faces the first edge 12E of the first portion 121, and the second edge 14E and the first edge 12E is spaced with a first distance D1.

The third structure 16 is disposed over the substrate 10. In some embodiments, the third structure 16 is an inertial structure which has a mass greater than that of the second structure 14. By way of example, the third structure 16 is a proof mass. The third structure 16 is supported by the second structure 14. In some embodiments, one end of the third structure 16 is coupled to the movable end of the second structure 14. In some embodiments, two or more ends of the third structure 16 are coupled to the movable ends of respective second structures 14. The third structure 16 is able to move or swing due to inertial effect when the device 100 experiences a force, an acceleration, a deceleration, a vibration, an impact or the like. In some embodiments, the third structure 16 is a part of the substrate 10, i.e. the substrate 10 and the third structure 16 may be formed of the same material and monolithically formed. The third structure 16 has a third edge 16E facing and spaced away from the first edge 12E of the first structure 12. Specifically, the third edge 16E faces the first edge 12E of the first structure 12, and the third edge 16E and the first edge 12E is spaced with a second distance D2.

The first protrusion 18 is disposed between the first edge 12E of the first portion 121 of the first structure 12 and the second edge 14E of the second structure 14. A first gap G1 is between the first protrusion 18 and the first edge 12E of the first portion 121. The first protrusion 18 is also referred to as a first bumper. In some embodiments, the first protrusion 18 is protruded from the second edge 14E, and extended toward the first edge 12E of the first portion 121. In some embodiments, the first protrusion 18 is a part of the second structure 14, and formed monolithically with the second structure 14. The first protrusion 18 has a first thickness t1. The second protrusion 20 is disposed between the first edge 12E of the second portion 122 of the first structure 12 and the third edge 16E of the third structure 16. A second gap G2 is between the second protrusion 20 and the first edge 12E of the second portion 122. The second protrusion 20 is also referred to as a second bumper. In some embodiments, the second protrusion 20 is protruded from the third edge 16E, and extended toward the first edge 12E of the second portion 122. The second protrusion 20 is a part of the third structure 16, and formed monolithically with the third structure 16. The second protrusion 20 has a second thickness t2.

In some embodiments, the first protrusion 18 is closer to the first edge 12E than the second protrusion 20, i.e., the first gap G1 is less than the second gap G2. By way of example, the first distance D1 is substantially equal to the second distance D2, while the first thickness t1 is greater than the second thickness t2. In some embodiments, the first distance D1 ranges from about 2 micrometers to about 3 micrometers. The difference between the first thickness t1 and the second thickness t2 is about 0.5 micrometers. Accordingly, the first protrusion 18 is closer to the first edge 12E than the second protrusion 20. The ratio of the first gap G1 to the second gap G2 may be modified based on various considerations.

When the device 100 does not experience a shock or a force, the second structure 14 and third structure 16 will be in their original positions without moving or rotating. When the device 100 experiences a shock or a force, the second structure 14 and third structure 16 may move or rotate, and the first protrusion 18 and the second protrusion 20 are configured as stoppers. In some embodiments, the first protrusion 18 is configured as a soft stopper because it is coupled to the second structure 14 which is resilient and compressible. The second protrusion 20 is configured as a hard stopper because it is coupled to the third structure 16, which is less resilient and less compressible compared to the second structure 14. The first protrusion 18 and the second protrusion 20 are adjacently arranged in such a manner therefore when the device 100 is undergone an huge shock, the first protrusion 18 gets to touch the first structure 12 before the second protrusion 20 gets to touch the first structure 12. Thus, the first protrusion 18 acts as a soft stopper, while the second protrusion 20 acts as a hard stopper if necessary. The numbers and positions of first structure 12 and second protrusion 20 may be modified based on various considerations. Some exemplary operation mechanisms of the first protrusion 18 and the second protrusion 20 are explained in the following descriptions.

Figure 2:
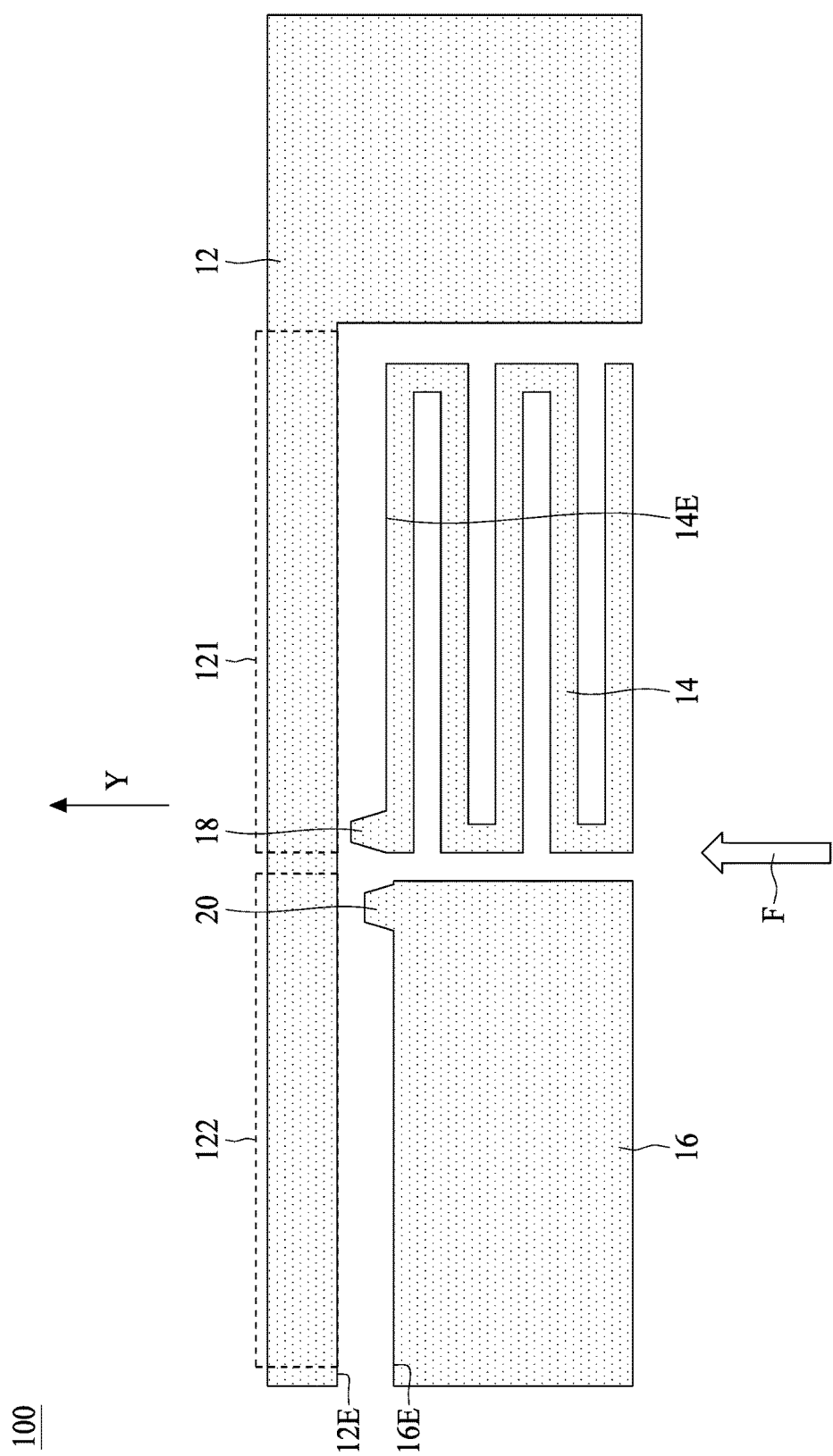
FIG. 2 is a schematic diagram of some embodiments of a device undergone a force within the maximum force tolerance.

FIG. 2 is a schematic diagram of some embodiments of a device undergone a force within the maximum force tolerance. As depicted in FIG. 2, when the device 100 experiences a force F in a direction Y in a plane due to a form of shock, both the second structure 14 and the third structure 16 coupled thereto will move or rotate toward the first structure 12 along the direction Y due to inertial effect. In some embodiments, at least one of the first structure 12, the second structure 14 or the third structure 16 is conductive. In some embodiments, the first structure 12 is conductive or covered with a conductive layer. In some embodiments, the second structure 14 is conductive or covered with a conductive layer. In some embodiments, the third structure 16 is conductive or covered with a conductive layer. Accordingly, the motion, acceleration or angular velocity of the third structure 16 can be sensed e.g., due to a capacitance variation between the third structure 16 and the first structure 12, or a capacitance variation between the third structure 16 and another respective conductive structure (not shown). In case the force F does not exceed the maximum force tolerance, the second structure 14 and third structure 16 will move or rotate toward the first structure 12 without contacting the first structure 12, and return to their initial positions.

Figure 3:
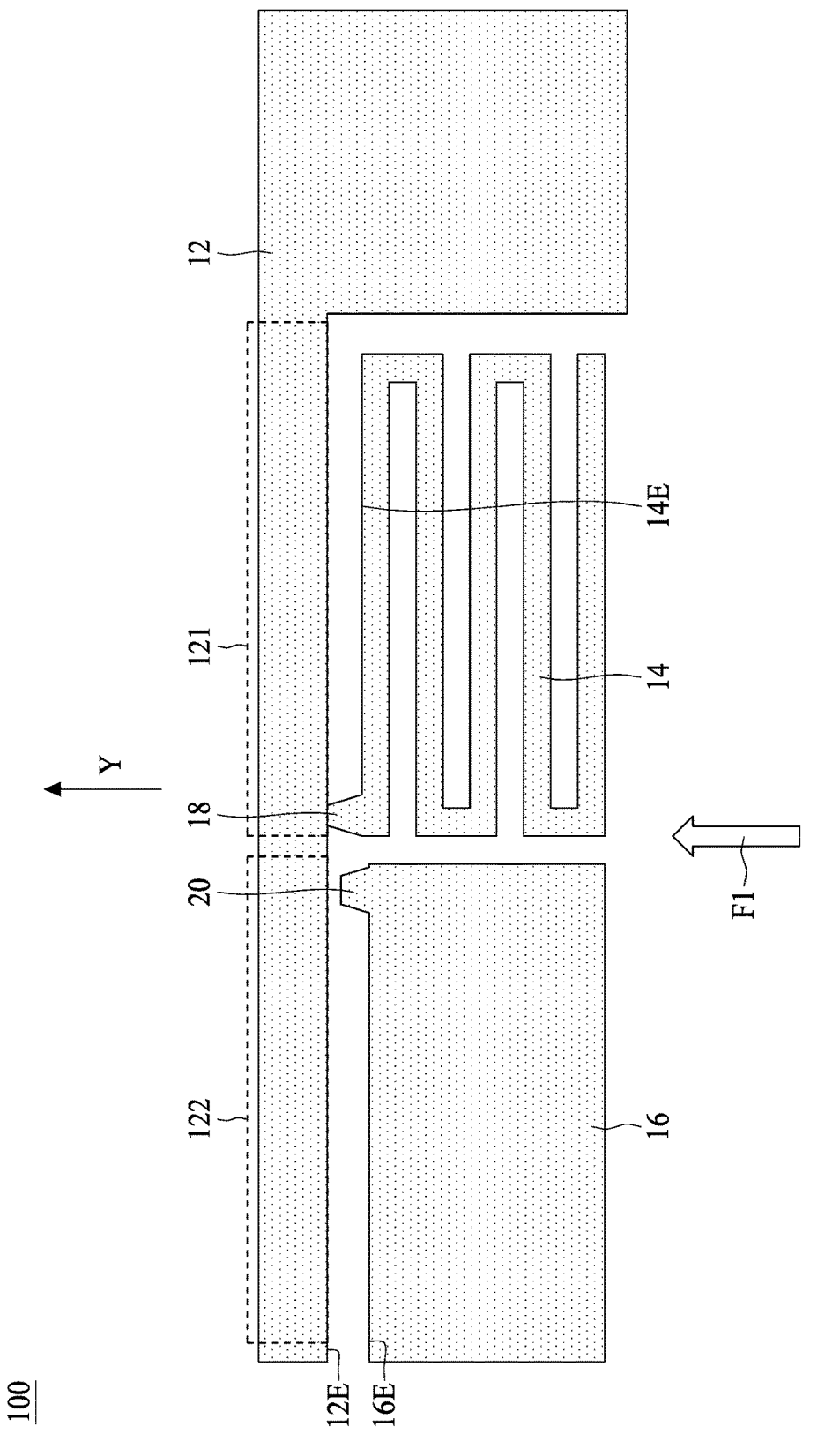
FIG. 3 is a schematic diagram of some embodiments of a device undergone a first force beyond the maximum force tolerance.

FIG. 3 is a schematic diagram of some embodiments of a device undergone a first force beyond the maximum force tolerance. As depicted in FIG. 3, when the device 100 experiences a first force F1 greater than the maximum force tolerance in direction Y in a plane due to another form of shock, the second structure 14 will move or rotate toward the first structure 12. Since the first protrusion 18 is protruded from the second edge 14E, the first protrusion 18 will contact both the first edge 12I and the second edge 14E. The first protrusion 18 is configured as a soft stopper because it is coupled to the second structure 14 which is resilient and compressible. Thus, the first protrusion 18 is configured as a cushion to absorb bumping momentum, thereby avoiding damage to the device 100. In such cases, the first protrusion 18 is able to prevent stiction from short time and high bump amount shock. In addition, the contact area between the first protrusion 18 and the first edge 12E is smaller compared to the contact area between the second structure 14 and the first edge 12E in the absence of the first protrusion 18. Thus, the first protrusion 18 is less prone to be adhered to the first edge 12E when contacting the first edge 12E. Since the first gap G1 is less than the second gap G2, the second protrusion 20 may not contact the first edge 12E of the second portion 122 of the first structure 12 if the first force F1 is not large enough, thereby preventing generation of particles due to collision.

Figure 4:
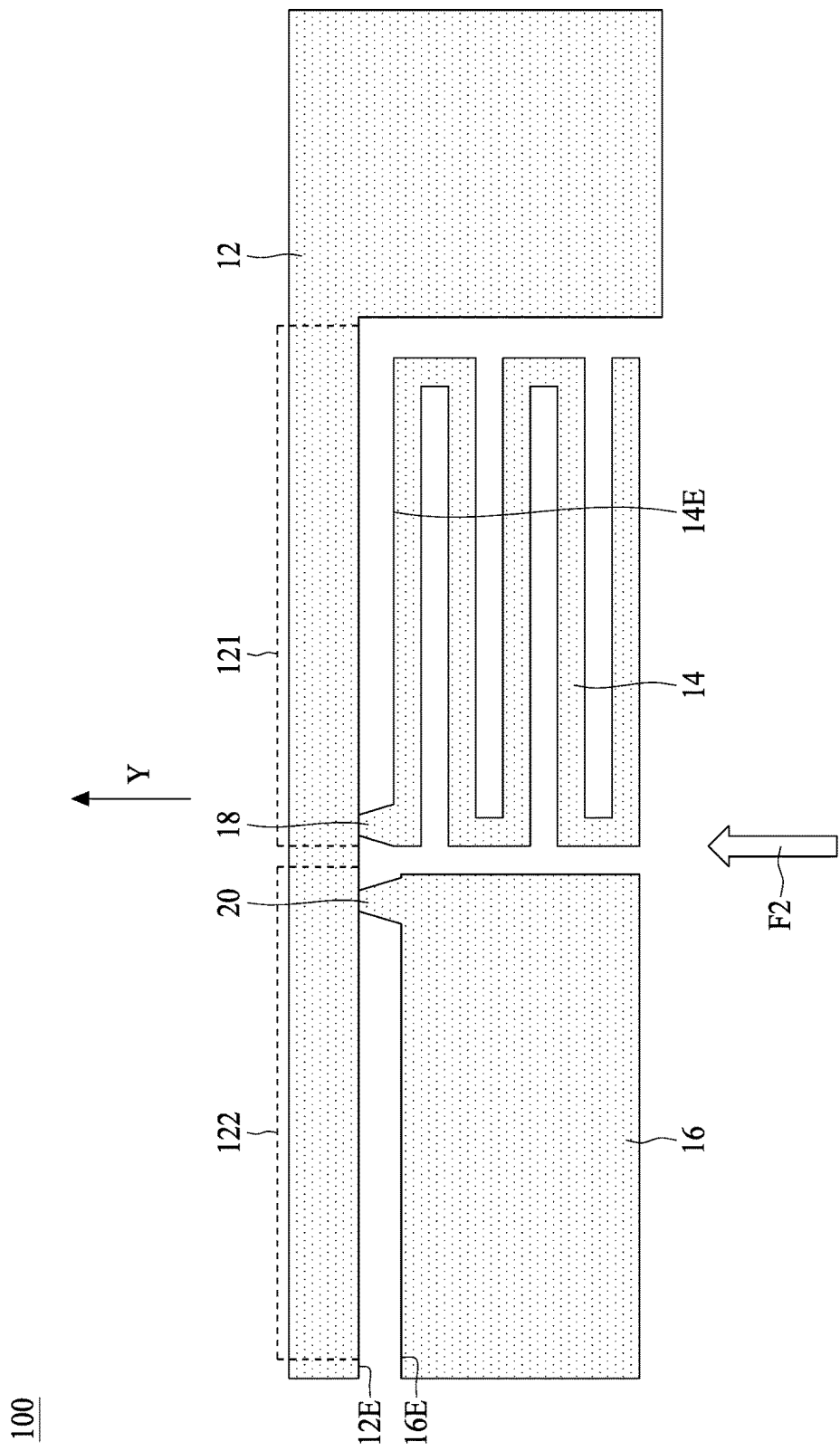
FIG. 4 is a schematic diagram of some embodiments of a device undergone a second force beyond the maximum force tolerance.

FIG. 4 is a schematic diagram of some embodiments of a device undergone a second force beyond the maximum force tolerance. As depicted in FIG. 4, when the device 100 experiences a second force F2 greater than the maximum force tolerance in direction Y in a plane due to still another form of shock, the second structure 14 will move or rotate toward the first structure 12, and thus the first protrusion 18 will contact the first edge 12E of the first portion 121 of the first structure 12. The first protrusion 18 is configured as a soft stopper because it is coupled to the second structure 14 which is resilient and compressible. Thus, the first protrusion 18 is served as a cushion to absorb bumping momentum, thereby avoiding damage to the device 100. The first protrusion 18 is able to prevent stiction from short time and high bump amount shock. In addition, the contact area between the first protrusion 18 and the first edge 12E is smaller compared to the contact area between the second structure 14 and the first edge 12E in the absence of the first protrusion 18.

Since the second protrusion 20 is protruded from the third edge 16E, the second protrusion 20 may contact both the first edge 12I and the third edge 16E in case the second force F2 is greater than the first force F1. The second protrusion 20 is configured as a hard stopper because it is coupled to the third structure 16, which is less resilient and less compressible compared to the second structure 14. Thus, the second protrusion 20 impedes the third structure 16 and the second structure 14 coupled thereto from further move toward the first edge 12E. Consequently, the second protrusion 20 is less prone to be adhered to the first edge 12E compared to the first protrusion 18. Accordingly, the second protrusion 20 is able to prevent the first protrusion 18 from being adhered to the first edge 12E. The second protrusion 20 is able to bear long time and high bump amount shock.

The device of the present disclosure is not limited to the above-mentioned embodiments, and may have other different embodiments. To simplify the description and for the convenience of comparison between each of the embodiments of the present disclosure, the identical components in each of the following embodiments are marked with identical numerals. For making it easier to compare the difference between the embodiments, the following description will detail the dissimilarities among different embodiments and the identical features will not be redundantly described.

Figure 6:
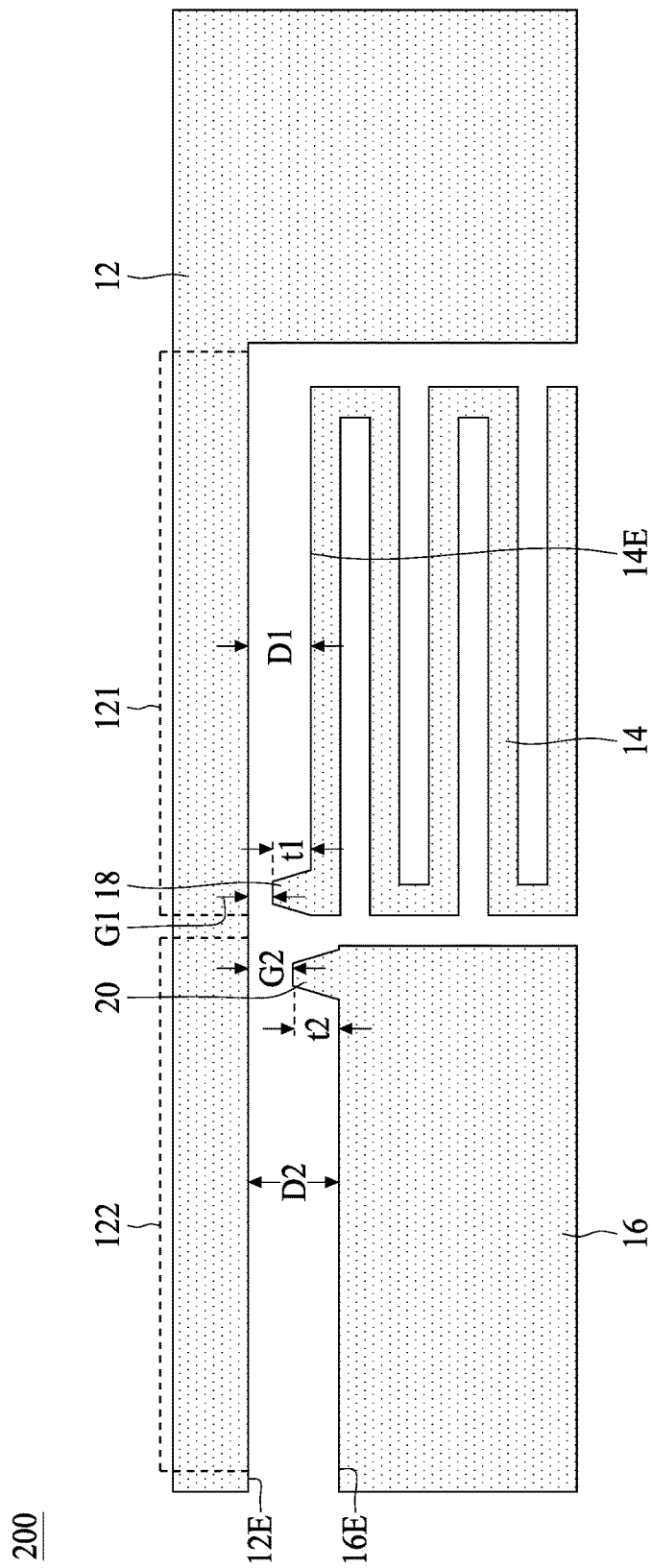
FIG. 6 is a schematic cross-sectional view of some embodiments of a device.

FIG. 6 is a schematic cross-sectional view of some embodiments of a device. As depicted in FIG. 6, the first protrusion 18 of the device 200 is protruded from the second edge 14E, and extended toward the first edge 12E of the first portion 121. The second protrusion 20 of the device 200 is protruded from the third edge 16E, and extended toward the first edge 12E of the second portion 122. In some embodiments, the first gap G1 is less than the second gap G2, but implemented in a different manner than that in FIGS. 1, 1A and 1B. By way of example, the first distance D1 is less than the second distance D2, and the first thickness t1 is substantially equal to the second thickness t2.

By virtue of the arrangement in FIG. 6, the first protrusion 18 is also configured as a soft stopper, and the second protrusion 20 is also configured as a hard stopper. When the device 200 is undergone a huge shock, the first protrusion 18 gets to touch the first structure 12 before the second protrusion 20 gets to touch the third structure 16.

Figure 5:
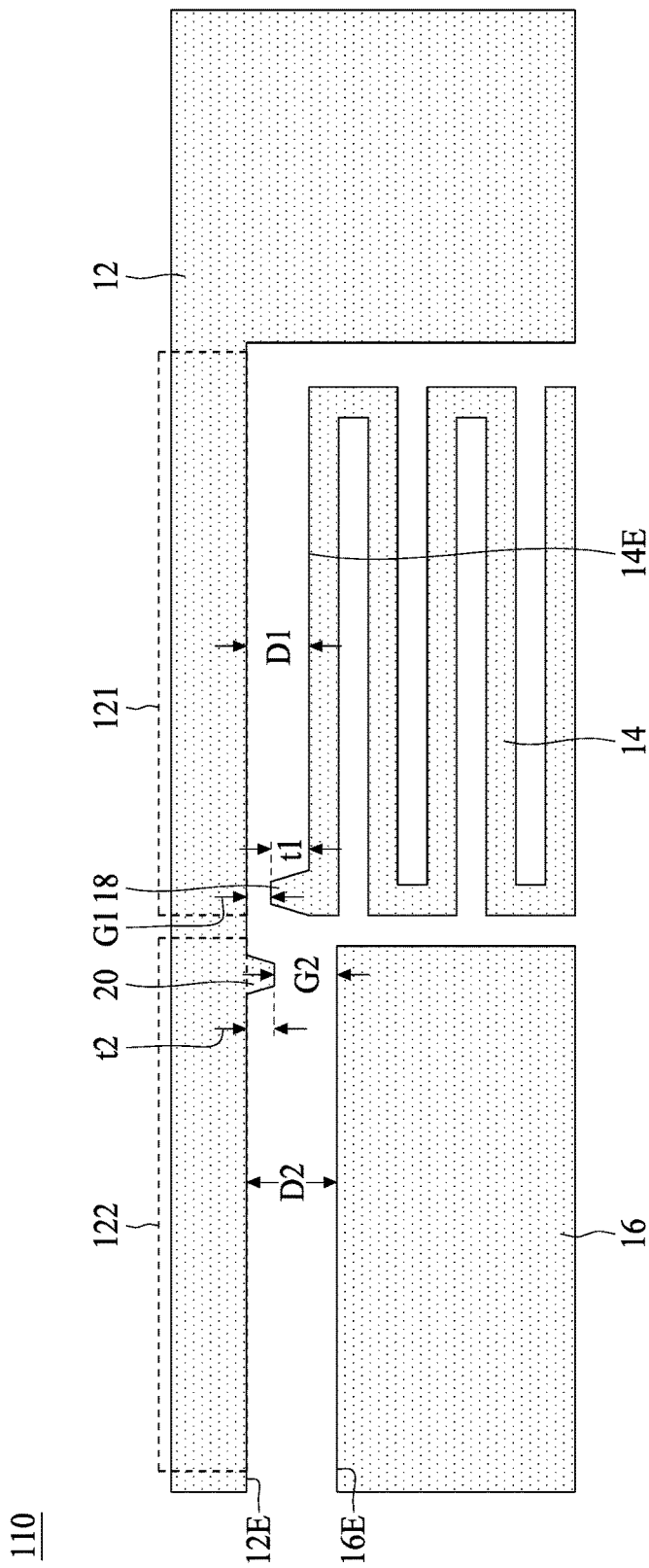
FIG. 5 is a schematic cross-sectional view of some embodiments of a device.

FIG. 5 is a schematic cross-sectional view of some embodiments of a device. The device 110 includes the substrate 10, the first structure 12, the second structure 14, the third structure 16, the first protrusion 18 and the second protrusion 20. As depicted in FIG. 5, one difference between the device 110 and the device 100 is that the second protrusion 20 of the device 110 is protruded from the first edge 12E of the second portion 122 of the first structure 12 and extended toward the third structure 16. The second protrusion 20 and the third edge 16E of the third structure 16 have a second gap G2. The first protrusion 18 is protruded from the second edge 14E of the second structure 14 and extended toward the first portion 121 of the first structure 12. That is, the first protrusion 18 and the second protrusion 20 are disposed on two opposite sides of the space between the first structure 12 and the second structure 14/the third structure 16. In some embodiments, the first distance D1 is substantially equal to the second distance D2, the first thickness t1 is greater than the second thickness t2, and the first gap G1 is less than the second gap G2.

In some alternative embodiments, the first protrusion 18 is protruded from the first edge 12E of the first portion 121 and extended toward the second structure 14, and the second protrusion 20 is protruded from the first edge 12E of the second portion 122 and extended toward the third structure 16.

By virtue of the arrangement in FIG. 6, the first protrusion 18 is also configured as a soft stopper, and the second protrusion 20 is also configured as a hard stopper. When the device 200 is undergone a huge shock, the first protrusion 18 gets to touch the first structure 12 before the second protrusion 20 gets to touch the third structure 16.

Figure 7:
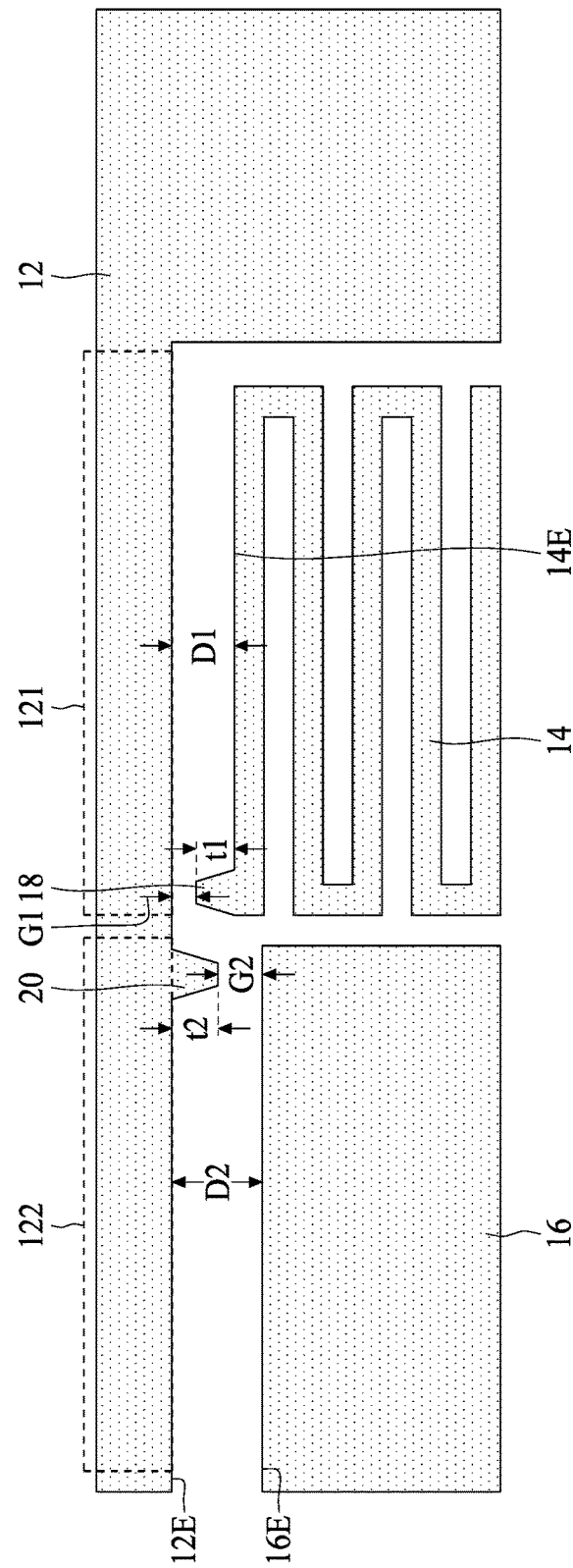
FIG. 7 is a schematic cross-sectional view of some embodiments of a device.

FIG. 7 is a schematic cross-sectional view of some embodiments of a device. As depicted in FIG. 7, the first protrusion 18 of the device 210 is protruded from the second edge 14E, and extended toward the first edge 12E of the first portion 121. The second protrusion 20 of the device 210 is protruded from the first edge 12E of the second portion 122 of the first structure 12 and extended toward the third structure 16. In some embodiments, the first gap G1 is less than the second gap G2, but implemented in a different manner than that in FIG. 6. By way of example, the first distance D1 is less than the second distance D2, and the first thickness t1 is substantially equal to the second thickness t2.

By virtue of the arrangement in FIG. 7, the first protrusion 18 is also configured as a soft stopper, and the second protrusion 20 is also configured as a hard stopper. When the device 110 is undergone a huge shock, the first protrusion 18 gets to touch the first structure 12 before the second protrusion 20 gets to touch the third structure 16.

In the present disclosure, the device includes the first protrusion between the resilient structure and the stationary structure and the second protrusion between the proof mass and the stationary structure. The first protrusion is closer to the stationary structure than the second protrusion. Accordingly, when the device experiences a shock, the first protrusion gets to contact the stationary structure before the second protrusion contacts the stationary structure. The first protrusion is coupled to the resilient structure with flexible characteristic, and thus is capable of reducing damage to the device in collision. The second protrusion is coupled to the proof mass or the stationary structure, which is less flexible, and thus is capable of reducing stiction issue.

In some embodiments, a device is provided. The device includes a substrate, a first structure, a second structure and a third structure. The first structure is over the substrate, and the first structure has a first portion and a second portion. The second structure is over the substrate. The second structure has a first protrusion protruded from an edge of the second structure and extended toward the first portion of the first structure. The third structure is over the substrate and supported by the second structure. The third structure has a second protrusion protruded from an edge of the third structure and extended toward the second portion of the first structure. A first gap between the first protrusion and the first portion is less than a second gap between the second protrusion and the second portion.

In some embodiments, a device is provided. The device includes a substrate, a first structure, a second structure, a third structure, a first protrusion and a second protrusion. The first structure is over the substrate, and the first structure has a first portion and a second portion. The second structure is over the substrate. The third structure is over the substrate and supported by the second structure. The first protrusion is protruded from an edge of the second structure and extended toward the first portion of the first structure. The second protrusion is protruded from an edge of the second portion of the first structure and extended toward the third structure. A first gap between the first protrusion and the first portion is less than a second gap between the second protrusion and the third structure.

In some embodiments, a MEMS device is provided. The MEMS device includes a substrate, a stationary structure, a resilient structure, a proof mass, a first bumper and a second bumper. The stationary structure is over the substrate, and the stationary structure has a first edge. The resilient structure is over the substrate. The resilient structure has a second edge facing and spaced away from the first edge of the stationary structure. The proof mass is over the substrate and supported by the resilient structure. The proof mass has a third edge facing and spaced away from the first edge of the stationary structure. The resilient structure is configured to allow the proof mass to move toward or away from the stationary structure in a direction. The first bumper and the second bumper are respectively between the first edge and the second edge, and between the first edge and the third edge. The first bumper and the second bumper are adjacently arranged in such a manner that when the MEMS device experiences a force in the direction, the first bumper contacts both the first edge and the second edge before the second bumper contacts both the first edge and the third edge.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   a substrate;
   a first structure over the substrate, the first structure having a first portion and a second portion;
   a second structure over the substrate, the second structure having a first protrusion protruded from an edge of the second structure and extended toward the first portion of the first structure; and
   a third structure over the substrate and supported by the second structure, the third structure having a second protrusion protruded from an edge of the third structure and extended toward the second portion of the first structure,
   wherein a first gap between the first protrusion and the first portion is less than a second gap between the second protrusion and the second portion.

2. The device of claim 1, wherein a first distance between the first portion of the first structure and the edge of the second structure is substantially equal to a second distance between the second portion of the first structure and the edge of the third structure.

3. The device of claim 2, wherein the first protrusion has a first thickness, the second protrusion has a second thickness, and the first thickness is greater than the second thickness.

4. The device of claim 3, wherein a difference between the first thickness and the second thickness is substantially 0.5 micrometers.

5. The device of claim 2, wherein the first distance is substantially ranged from 2 micrometers to 3 micrometers.

6. The device of claim 1, wherein the first protrusion and the second structure are monolithically formed, and the second protrusion and the third structure are monolithically formed.

7. The device of claim 1, where the first structure is stationary structure, the second structure is a resilient structure, the third structure is a proof mass coupled to the resilient structure, and the resilient structure is configured to allow the proof mass to move toward or away from the stationary structure.

8. The device of claim 7, wherein the resilient structure has a winding pattern.

9. The device of claim 1, wherein the first structure is conductive.

10. The device of claim 1, wherein the second structure is conductive.

11. The device of claim 1, wherein the third structure is conductive.

12. The device of claim 1, wherein the second protrusion is less resilient than the first protrusion.

13. A MEMS device, comprising:
    a substrate;
    a stationary structure over the substrate, the stationary structure having a first edge;
    a resilient structure over the substrate, the resilient structure having a second edge facing and spaced away from the first edge of the stationary structure;
    a proof mass over the substrate and supported by the resilient structure, the proof mass having a third edge facing and spaced away from the first edge of the stationary structure, wherein the resilient structure is configured to allow the proof mass to move toward or away from the stationary structure in a direction; and
    a first bumper and a second bumper respectively between the first edge and the second edge, and between the first edge and the third edge, wherein the first bumper and the second bumper are adjacently arranged in such a manner that when the MEMS device experiences a force in the direction, the first bumper contacts both the first edge and the second edge before the second bumper contacts both the first edge and the third edge.

14. The MEMS device of claim 13, wherein the first bumper has a first thickness, the second bumper has a second thickness, and the first thickness is greater than the second thickness.

15. The MEMS device of claim 14, wherein a first distance between the first edge and the second edge is equal to a second distance between the first edge and the third edge.

16. The MEMS device of claim 14, wherein a difference between the first thickness and the second thickness is substantially 0.5 micrometers.

17. The MEMS device of claim 13, wherein the first bumper is disposed on the second edge of the resilient structure.

18. The MEMS device of claim 13, wherein the second bumper is disposed on the third edge of the proof mass.

19. The MEMS device of claim 13, wherein the resilient structure has a winding pattern.

20. The MEMS device of claim 13, wherein the second bumper is less resilient than the first bumper.

* * * * *